(12) United States Patent
Lu

(10) Patent No.: US 8,539,427 B2
(45) Date of Patent: Sep. 17, 2013

(54) DEVICE MISMATCH CORNER MODEL

(75) Inventor: Ning Lu, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/342,374

(22) Filed: Jan. 3, 2012

(65) Prior Publication Data

US 2013/0174109 A1 Jul. 4, 2013

(51) Int. Cl.
*G06F 17/50* (2006.01)

(52) U.S. Cl.
USPC .......................................................... 716/136

(58) Field of Classification Search
USPC .......................................................... 716/136
See application file for complete search history.

(56) References Cited

U.S. PATENT DOCUMENTS

| | | | |
|---|---|---|---|
| 6,018,623 A | 1/2000 | Chang et al. | |
| 6,195,593 B1 * | 2/2001 | Nguyen | 700/97 |
| 6,560,755 B1 | 5/2003 | Zhang et al. | |
| 6,708,316 B2 * | 3/2004 | Madni et al. | 716/115 |
| 6,978,229 B1 | 12/2005 | Saxena et al. | |
| 7,171,364 B2 | 1/2007 | Kouzu | |
| 7,685,555 B1 * | 3/2010 | Bertrand et al. | 716/102 |
| 7,716,023 B2 | 5/2010 | Barker et al. | |
| 7,848,907 B2 | 12/2010 | Lu | |
| 7,937,256 B2 | 5/2011 | Tseng et al. | |
| 2006/0047492 A1 | 3/2006 | Chang et al. | |
| 2007/0198956 A1 | 8/2007 | Liu et al. | |
| 2008/0140363 A1 | 6/2008 | Lin et al. | |
| 2009/0306953 A1 | 12/2009 | Liu et al. | |
| 2011/0040548 A1 | 2/2011 | Khalily et al. | |
| 2011/0093242 A1 | 4/2011 | Lu | |
| 2011/0140745 A1 | 6/2011 | Buck et al. | |
| 2011/0302546 A1 * | 12/2011 | Mottaez et al. | 716/132 |
| 2011/0302547 A1 * | 12/2011 | Mottaez | 716/132 |
| 2012/0054709 A1 * | 3/2012 | Tsai et al. | 716/122 |

OTHER PUBLICATIONS

Disclosed Anonymously, "Method and System for Generating Flexible Corner Models", IP.com Prior Art Database, Mar. 23, 2010, 5 pages, Disclosure No. IPCOM000194409D, http://priorartdatabase.com/IPCOM/000194409.

G. Rappitsch et al., "SPICE Modeling of Process Variation Using Location Depth Corner Models", IEEE Transactions on Semiconductor Manufacturing, May 2004, pp. 201-213, vol. 17, No. 2.

M. Chen et al., "Circuit-level Mismatch Modelling and Yield Optimization for CMOS Analog Circuits", IEEE, 2007, pp. 526-532.

* cited by examiner

*Primary Examiner* — Vuthe Siek
*Assistant Examiner* — Mohammed Alam
(74) *Attorney, Agent, or Firm* — David Cain; Roberts Mlotkowski Safran & Cole, P.C.

(57) ABSTRACT

A device mismatch corner model for semiconductor device simulation is provided. A method of providing the device mismatch corner model for semiconductor device simulation, includes selecting a type of electric performance target F for a type of device, determining a number N of semiconductor devices for which mismatches among electric performance targets of the semiconductor devices are simulated, and determining a desired k-sigma mismatch corner value among $N(N-1)/2$ pairs of the electric performance targets. The method further includes identifying at least one electric parameter P of the semiconductor devices that has a mismatch component and contributes to the mismatches among the electric performance targets of the semiconductor devices, determining a plurality of corner values for the at least one electrical parameter P, and running at most N circuit simulations based on the determined plurality of corner values which are recalculated for each of the circuit simulations.

24 Claims, 4 Drawing Sheets

DEVICE MISMATCH CORNER MODEL

FIELD OF THE INVENTION

The invention relates to semiconductor devices and methods of simulation and, more particularly, to a device mismatch corner model for semiconductor device simulation.

BACKGROUND

As feature sizes of semiconductor devices (e.g., very-large-scale integration (VLSI) circuits) become smaller, variations in these semiconductor devices become larger. Such variations include random variations and systematic variations. For example, random (e.g., uncorrelated) variations affect relative characteristics of closely-placed identical devices (often called matching or mismatch). Other device and circuit examples involving random variations include mismatch among multiple identical n-type field-effect transistors (NFETs) used in a ring oscillator, mismatch among multiple identical p-type field-effect transistors (PFETs) used in a ring oscillator, and mismatch among multiple identical fingers in a multi-finger radio frequency (RF) field-effect transistor (FET) or metal-oxide-semiconductor (MOS) varactor.

From the viewpoint of circuit modeling, systematic variations affect all instances of a device (e.g., all gate oxide thicknesses of NFETs) together, and there is no relative difference between any two instances of the device. On the other hand, random variations affect each instance of a device from any other instances of the device, e.g., FET threshold voltage ($V_t$) variation caused by random doping fluctuations, a random part of FET channel length variation, and mismatch among a group of nearby and identical resistors. In these cases of random variations, a relative difference between any two instances of a device is the subject of mismatch modeling.

For analog circuits, device mismatch is one of limiting factors for circuit performance. For semiconductor devices, there exist statistical models for device mismatch. For example, circuit designers can use a Monte Carlo model for device mismatch to simulate and evaluate an effect of device mismatch on circuit performance. More specifically, an electric performance target F in each of a group of N semiconductor devices (or circuits) is affected by one or more statistical parameters P, Q, R, S, . . . . Namely, a performance target $F_1$ of a first device depends on statistical parameters $P_1$, $Q_1$, $R_1$, $S_1$, . . . , a performance target $F_2$ of a second device is affected by statistical parameters $P_2$, $Q_2$, $R_2$, $S_2$, . . . , and a performance target $F_N$ of an Nth device is a function of statistical parameters $P_N$, $Q_N$, $R_N$, $S_N$, . . . .

$$F_i = f(P_i, Q_i, R_i, S_i, \ldots), i=1,2,3,\ldots,N. \tag{1.0}$$

For each device (or circuit), one of statistical parameters (say, the parameter P) has a mismatch component, and other statistical parameters have global components only. For example, the electrical parameter P can be a threshold voltage of a metal-oxide-semiconductor field-effect transistor (MOSFET), a channel length of the MOSFET, a sheet resistance of one of a poly and a diffused resistor, or an area density of a capacitance of a capacitor, etc.

Mismatch among N performance targets $F_1, F_2, \ldots, F_N$ are affected by mismatch among N statistical mismatch parameters $P_1, P_2, \ldots, P_N$. To model mismatch among the N parameters $P_1, P_2, \ldots, P_N$, means and variances of the N parameters $P_1, P_2, \ldots, P_N$ and mismatch values among them may have several requirements. First, each of the devices may have to have a same predetermined mean μ for the parameter $P_i$, as determined by the following equation:

$$\langle P_i \rangle = \mu, i=1,2,3,\ldots,N. \tag{1.1}$$

Second, each of the devices may have to have a same variance for the parameter $P_i$, as determined by the following equation:

$$\langle (P_i - \langle P_i \rangle)^2 \rangle = \sigma_{cm}^2 + \frac{1}{2}\sigma_{m0}^2, i = 1, 2, 3, \ldots, N, \tag{1.2}$$

where $\sigma_{cm}$ is a standard deviation for chip mean (systematic, global, or correlated) part of variations (e.g., standard deviations) and $\sigma_{m0}$ is a standard deviation for mismatch part of variations.

Third, each pair of the devices may have to have a same mismatch value for the parameters $P_i$ and $P_j$, as determined by the following equation:

$$\langle (P_i - P_j)^2 \rangle = \frac{1}{L}\sum_{l=1}^{L}(P_{i,l} - P_{j,l})^2 = \sigma_{m0}^2, \tag{1.3}$$

$$i, j = 1, 2, 3, \ldots, N, i \neq j,$$

where L is a number of circuit simulation runs.

The Monte Carlo model for adjacent device mismatch may be determined by determining the parameter $P_i$ for each of the devices, as follows:

$$P_i = \mu + \sigma_{cm}G + \frac{1}{\sqrt{2}}\sigma_{m0}g_i, i = 1, 2, 3, \ldots, N, \tag{1.4}$$

where each of G, $g_1$, $g_2$, $g_3$, . . . , $g_N$ is an independent stochastic or random variable of a mean of zero and a standard deviation of 1, $\sigma_{cm}G$ represents a global component of statistical variation in $P_i$, and $\sigma_{m0}g_i$ represents a mismatch component of statistical variation in $P_i$.

The Monte Carlo model (1.4) satisfies the requirements (1.1), (1.2), and (1.3), and thus, can be a model for mismatch among the N statistical parameters $P_1, P_2, \ldots,$ and $P_N$. Monte Carlo simulations are run using the Monte Carlo model to evaluate the effect of device mismatch on circuit performance. However, the Monte Carlo simulations take a long time to complete since they require up to tens of thousands of runs using a random number generator to determine the Gaussian distributions in the Monte Carlo model. In addition, most of the determined parameters and mismatches are not of interest because they are not worst-case values.

Accordingly, there exists a need in the art to overcome the deficiencies and limitations described hereinabove.

SUMMARY

In a first aspect of the invention, a method of providing a device mismatch corner model for semiconductor device simulation, includes selecting a type of electric performance target F for a type of device, determining a number N of semiconductor devices for which mismatches among electric performance targets of the semiconductor devices are simulated, and determining a desired k-sigma mismatch corner value among N(N−1)/2 pairs of the electric performance targets. The method further includes identifying at least one electric parameter P of the semiconductor devices that has a mismatch component and contributes to the mismatches among the electric performance targets of the semiconductor devices, and determining a plurality of corner values for the at least one electrical parameter P. The method further includes running at most N circuit simulations based on the determined plurality of corner values which are recalculated for each of the circuit simulations, and post-processing results of the N circuit simulations to achieve simultaneous mismatch among N(N−1)/2 pairs of the electric performance targets.

In yet another aspect of the invention, a method for semiconductor device simulation, includes determining a number N of semiconductor devices which have mismatch in at least three respective parameters. The method further includes determining a plurality of corner values for the at least three respective parameters. The method further includes running (N−1) circuit simulations based on the determined plurality of corner values which are recalculated for each of the circuit simulations.

In another aspect of the invention, a computer program product includes a tangible computer usable storage medium having readable program code embodied in the tangible computer usable storage medium. The computer program product further includes at least one component operable to determine a number N of semiconductor devices which have mismatch in at least three respective parameters. The at least one component is further operable to determine a plurality of corner values for the at least three respective parameters. The at least one component is further operable to run at most N circuit simulations based on the determined plurality of corner values which are recalculated for each of the circuit simulations.

In another aspect of the invention, a system implemented in hardware, includes a computer infrastructure operable to determine a number N of semiconductor devices which have mismatch in at least three respective parameters. The computer infrastructure is further operable to determine a plurality of corner values for the at least three respective parameters. The computer infrastructure is further operable to run N circuit simulations based on the determined plurality of corner values which are recalculated for each of the circuit simulations.

In yet another aspect of the invention, a computer system for providing a device mismatch corner model for semiconductor device simulation, includes a CPU, a computer readable memory and a tangible computer readable storage media. The system further includes first program instructions to determine a number N of semiconductor devices which have mismatch in at least three respective parameters. The system further includes second program instructions to determine a plurality of corner values for the at least three respective parameters based on the number N of the semiconductor devices. The system further includes third program instructions to run (N−1) or N circuit simulations based on the determined plurality of corner values which are recalculated for each of the circuit simulations, and based on user input. The system further includes fourth program instructions to process one or more results of the at most N circuit simulations to determine one or more worst-case effects of the mismatch of the semiconductor devices. The first, second, third, and fourth program instructions are stored on the tangible computer readable storage media for execution by the CPU via the computer readable memory.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
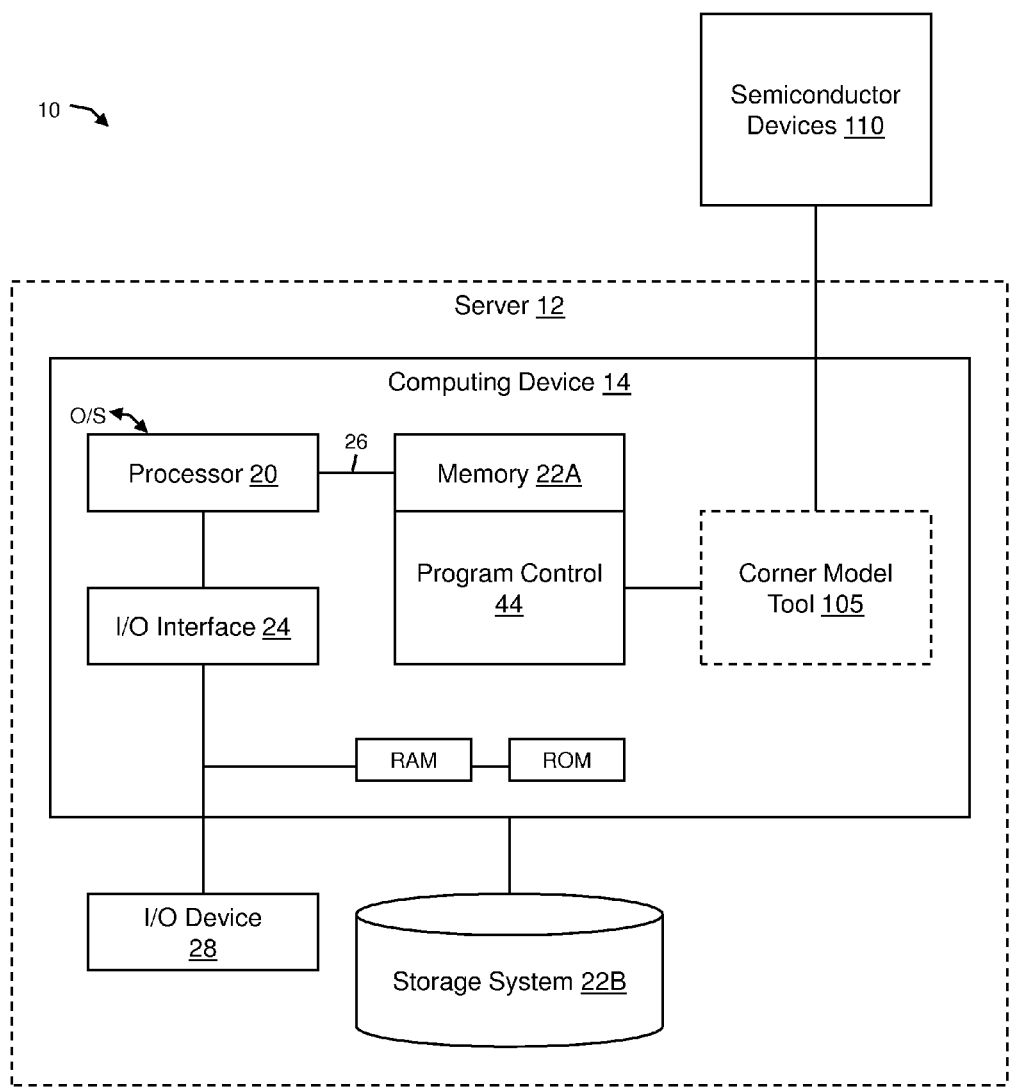
FIG. 1 is an exemplary environment for implementing steps in accordance with aspects of the invention.

The invention relates to semiconductor devices and methods of simulation and, more particularly, to a device mismatch corner model for semiconductor device simulation. More specifically, in embodiments, the present invention includes a corner model tool which can quickly simulate an effect of device mismatch (e.g., parameter difference) in very-large-scale integration (VLSI) circuits, e.g., analog circuits. To accomplish this, the corner model tool may determine and use a corner model to simulate device mismatch. For global or systematic statistical variations, the corner model may be determined and simulated more efficiently than a Monte Carlo model since all devices are affected by global statistical variations in a same amount. For mismatch variations, the corner model may also be determined and simulated more efficiently than the Monte Carlo model. Instead of running tens of thousands of Monte Carlo simulations, when a same mismatch value among N devices is desired for circuit simulation, the corner model tool may advantageously run (N−1) circuit simulations based on the determined corner model to obtain the desired mismatch value among N(N−1)/2 pairs of devices.

More specifically, in embodiments, the corner model tool can determine a device model (e.g., a SPICE (Simulation Program with Integrated Circuit Emphasis) model, a FET model, a resistor model, a capacitor model, etc.) of semiconductor devices to be simulated. In embodiments, the device model may be determined based on input data from a circuit designer with knowledge of a circuit and mismatches between the semiconductor devices. Once the device model is determined, the corner model tool may determine a number N of the semiconductor devices for circuit simulation based on the device model, and run (N−1) or N corner simulations, e.g., circuit simulations. In embodiments, the running of the corner simulations may include determining electrical parameters (e.g., corner values) of the semiconductor devices based on an (N−1) or N corner model, and running (N−1) or N circuit simulations based on the determined corner values. The determined corner values may represent extreme values for the respective electrical parameters of interest. The corner model used (e.g., the (N−1) or N corner model) may be dependent on the number N of the semiconductor devices which are to have mismatched electrical parameters.

Advantageously, in embodiments, the present invention can more efficiently simulate device mismatch in an integrated circuit by running only (N−1) or N circuit simulations based on a respective device mismatch corner model, instead of running up to tens of thousands of circuit simulations based on a Monte Carlo model. Further, by running more than one circuit simulation, the present invention may achieve an equal mismatch value among N(N−1)/2 pairs from N adjacent and approximately identical devices simultaneously, where N is greater than 2. Accordingly, the present invention may minimize circuit simulation time and resources required to determine the effect of random device mismatch on circuit performance.

System Environment

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

FIG. 1 shows an illustrative environment 10 for managing the processes in accordance with the invention. To this extent, the environment 10 includes a server or other computing system 12 that can perform the processes described herein. In embodiments, the server 12 may include any mobile computing device, such as a mobile phone, a laptop, a video camera, etc. In particular, the server 12 includes a computing device 14. The computing device 14 can be resident on a network infrastructure or computing device of a third party service provider (any of which is generally represented in FIG. 1).

The computing device 14 also includes a processor 20, memory 22A, an I/O interface 24, and a bus 26. The memory 22A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S).

The computing device 14 is in communication with an external I/O device/resource 28 and the storage system 22B. For example, the I/O device 28 can comprise any device that enables an individual to interact with the computing device 14 (e.g., user interface) or any device that enables the computing device 14 to communicate with one or more other computing devices using any type of communications link. The external I/O device/resource 28 may be for example, a handset, keyboard, etc.

In general, the processor 20 executes computer program code (e.g., program control 44), which can be stored in the memory 22A and/or storage system 22B. Moreover, in accordance with aspects of the invention, the program control 44 controls a corner model tool 105, e.g., the processes described herein. The corner model tool 105 can be implemented as one or more program code in the program control 44 stored in memory 22A as separate or combined modules. Additionally, the corner model tool 105 may be implemented as separate dedicated processors or a single or several processors to provide the function of this tool. In embodiments, the corner model tool 105 may be implemented in one or more process design kits (PDKs) and statistical static timing analysis (SSTA) tools and models, for semiconductor devices. Moreover, it should be understood by those of ordinary skill in the art that the corner model tool 105 is used as a general descriptive term for providing the features and/or functions of the present invention.

While executing the computer program code, the processor 20 can read and/or write data to/from memory 22A, storage system 22B, and/or I/O interface 24. The program code executes the processes of the invention, for example, functions of the corner model tool 105, e.g., provide a device mismatch corner model for semiconductor device simulation. The bus 26 provides a communications link between each of the components in the computing device 14.

In embodiments, the corner model tool 105 can determine and use a device mismatch corner model for circuit simulations of one or more semiconductor devices 110 in a circuit, to evaluate an effect of device mismatch on circuit performance. The semiconductor devices 110 may include any types of semiconductor devices, such as, for example, field-effect transistors (FETs), multiple identical n-type field-effect transistors (NFETs) used in a ring oscillator, multiple identical p-type field-effect transistors (PFETs) used in a ring oscillator, multiple identical fingers in a multi-finger radio frequency (RF) FET or metal-oxide-semiconductor (MOS) varactor, resistors, and/or capacitors. Device mismatch occurs when, e.g., two adjacent and identical (or nearly identical) devices include statistical differences in electrical parameters, e.g., currents, resistances, capacitances, and/or channel lengths. More specifically, in embodiments, each of a group of the N semiconductor devices 110 may be adjacent and approximately identical, and may include a different electrical parameter P, e.g., a first device may include a parameter $P_1$, a second device may include a parameter $P_2$, and a Nth device may include a parameter $P_N$. The electrical parameter P may include a threshold voltage of a metal-oxide-semiconductor field-effect transistor (MOSFET), a channel length of the MOSFET, a sheet resistance of a poly or a diffused resistor, an area density of a capacitance of a capacitor, etc.

In accordance with further aspects of the invention, to model mismatch among the N parameters $P_1, P_2, \ldots,$ and $P_N$, the corner model can be used that meets requirements for means and variances of the N parameters $P_1, P_2, \ldots,$ and $P_N$ and mismatch values among them, as discussed above. By utilizing the corner model, when a same mismatch value among the N semiconductor devices 110 is desired for circuit simulation, the corner model tool 105 may advantageously run (N−1) circuit simulations to obtain the desired mismatch value among N(N−1)/2 pairs of devices. This is more efficient than running up to tens of thousands of Monte Carlo simulations based on a Monte Carlo model for device mismatch.

Before determining and simulating the corner model, in embodiments, the corner model tool 105 can determine a device model, e.g., a SPICE (Simulation Program with Integrated Circuit Emphasis) model, a FET model, a resistor model, and/or a capacitor model, of the semiconductor devices 110 to be simulated. The device model may be determined based on input data from a circuit designer with knowledge of the circuit and mismatches between the semiconductor devices 110. The corner model tool 105 may receive such input data via the I/O device 28. Based on the received input data, the corner model tool 105 may determine the number N of the adjacent and approximately identical semiconductor devices 110 in the group, where correlations (e.g., mismatches) among the N semiconductor devices 110 affect circuit performance and are thus, being simulated and evaluated for the particular circuit. The particular circuit may have additional semiconductor devices of a same type as the semiconductor devices 110 that are not in the group and thus, not simulated.

In embodiments, based on the input data, the corner model tool 105 can further determine one or more indices for the semiconductor devices 110 of the device model. Each of the indices may indicate a sequence of each of the semiconductor devices 110. For example, an index "1" may be determined for a first device, an index "2" may be determined for a second device, and so on. Further based on the input data, the corner model tool 105 may also determine one or more electrical parameters (e.g., currents, resistances, capacitances, and/or channel lengths) pertinent for the semiconductor devices 110 of the device model. These electrical parameters (e.g., $P_1$, $P_2$, and $P_N$) may be used for determining and simulating the device mismatch corner model.

Once the device model is determined, in embodiments, the corner model tool 105 can determine the number N of the semiconductor devices 110 for circuit simulation based on the device model. The corner model tool 105 may determine whether to run Monte Carlo simulations or corner (model) simulations based on the received input data from the circuit designer. When the Monte Carlo simulations are determined to be run, the corner model tool 105 may determine electrical parameters of the semiconductor devices 110 based on a Monte Carlo model, as discussed above, and may run up to tens of thousands of circuit simulations based on the determined electrical parameters. When the corner simulations are determined to be run, the corner model tool 105 can determine electrical parameters (e.g., corner values) of the semiconductor devices 110 based on the corner model, as discussed herein, and may run (N−1) or N circuit simulations based on the determined corner values. The determined corner values may represent extreme values for the respective electrical parameters of interest. The corner model used may be changed based on the number N of the semiconductor devices 110 which are to have mismatched electrical parameters.

Before determining the corner values and running the corner simulations, the corner model tool 105 can assign the number N to each of the semiconductor devices 110 in the group. For a semiconductor device which is not in the group of the semiconductor devices 110, the corner model tool 105 may assign the number "1" to the semiconductor device. The corner model tool 105 may further assign the determined indices to the respective semiconductor devices 110 in the group. For example, the index "1" may be assigned to a first device of the semiconductor devices 110, the index "2" may be assigned to a second device of the semiconductor devices 110, and so on. The corner model tool 105 may further determine whether to perform a (N−1)-run process or an N-run process, for determining and simulating the corner model, based on the received input from the circuit designer.

When the (N−1)-run process is determined to be performed, the corner model tool 105 can determine (N−1)-run corner values (e.g., electrical parameters P) of the semiconductor devices 110 based on a respective (N−1)-run corner model for device mismatch. For example, a (N−1)-run corner model for mismatch between two adjacent and approximately identical devices may desire to achieve a mismatch value of $k\sigma_{m0}$, as shown in the following equation:

$$P_1 - P_2 = k\sigma_{m0}, \quad (1.5)$$

where k indicates a k-sigma mismatch corner value among electric performance targets $F_1, F_2, \ldots, F_N$, the value of k can be 1, 2, 3, etc., and $\sigma_{m0}$ is a standard deviation for mismatch part of variations, e.g., standard deviations.

For example, the desired mismatch value may be $3\sigma_{m0}$ such that it is within an upper corner of a probability distribution of each electrical parameter, although other values are contemplated by the invention. To achieve the desired mismatch value, the corner model tool 105 may determine and set the parameters $P_1$ and $P_2$ (e.g., corner values) based on the following equations:

$$P_1 = \mu + s\sigma_{cm} + \frac{1}{2}k\sigma_{m0}, \quad (1.6a)$$

$$P_2 = \mu + s\sigma_{cm} - \frac{1}{2}k\sigma_{m0}, \quad (1.6b)$$

where $\mu$ is a mean value for the parameters $P_1$ and $P_2$, s is a corner value for chip mean part of variation, and $\sigma_{cm}$ is a standard deviation for chip mean (systematic, global, or correlated) part of variations.

For corner models among three (or more) devices that need a single circuit simulation run to simulate device mismatch, the corner model tool 105 can achieve two equal adjacent mismatch values of $k\sigma_{m0}$ simultaneously, as shown in the following equations:

$$P_1 - P_2 = P_2 - P_3 = k\sigma_{m0}, \quad (1.7a)$$

$$P_1 - P_3 = 2k\sigma_{m0}. \quad (1.7b)$$

However, for corner models among three devices that need a single circuit simulation run to simulate device mismatch, the corner model tool 105 cannot achieve three equal adjacent mismatch values of $k\sigma_{m0}$ simultaneously, as shown in the following equation:

$$P_1 - P_2 = P_2 - P_3 = P_1 - P_3 = k\sigma_{m0}, k \neq 0. \quad (1.8a)$$

That is, for corner models among three or more devices that perform a single circuit simulation run to simulate device mismatch, the corner model tool 105 cannot achieve three or more equal adjacent mismatch values of $k\sigma_{m0}$ simultaneously, as shown in the following equation:

$$P_i - P_j = k\sigma_{m0}, k \neq 0, i,j = 1,2,3,\ldots,N, N \geq 3. \quad (1.9)$$

In embodiments, in a (N−1)-run corner model for mismatch between three devices, to achieve an equal adjacent mismatch value of $k\sigma_{m0}$ among three pairs from three devices simultaneously, the corner model tool 105 can perform (N−1) or 2 circuit simulation runs, instead of a single circuit simulation run. The equal adjacent mismatch value of $k\sigma_{m0}$ among three pairs from three devices may be achieved, as shown in the following equation:

$$\frac{1}{2}\sum_{l=1}^{2}(P_{i,l} - P_{j,l})^2 = (k\sigma_{m0})^2, i, j = 1, 2, 3, i \neq j, \quad (2.1)$$

where l is a number of circuit simulation runs.

For a first circuit simulation run using the (N−1)-run corner model for mismatch between three devices, to achieve the equal adjacent mismatch value, the corner model tool 105 can determine and set the parameters $P_{1,1}$, $P_{2,1}$, and $P_{3,1}$ (e.g., corner values) based on the following equations:

$$P_{1,1} = \mu + s\sigma_{cm} + \frac{1}{2}k\sigma_{m0}, \quad (2.2a)$$

$$P_{2,1} = \mu + s\sigma_{cm} - \frac{1}{2}k\sigma_{m0}, \quad (2.2b)$$

$$P_{3,1} = \mu + s\sigma_{cm}. \quad (2.2c)$$

An average of the parameters $P_{1,1}$, $P_{2,1}$, and $P_{3,1}$ is at the chip-mean corner point of $s\sigma_{cm}$, as shown in the following equation:

$$\frac{1}{3}(P_{1,1} + P_{2,1} + P_{3,1}) = \mu + s\sigma_{cm}. \quad (2.3)$$

Mismatch values from the first circuit simulation run may be determined based on the following equations:

$$P_{1,1} - P_{2,1} = \sqrt{2k}\,\sigma_{m0}, \quad (2.4a)$$

$$P_{1,1} - P_{3,1} = \frac{1}{\sqrt{2}}k\sigma_{m0}, \quad (2.4b)$$

$$P_{2,1} - P_{3,1} = -\frac{1}{\sqrt{2}}k\sigma_{m0}. \quad (2.4c)$$

For a second circuit simulation run using the (N−1)-run corner model for mismatch between three devices, to achieve the equal adjacent mismatch value, the corner model tool 105 can determine and set the parameters $P_{1,2}$, $P_{2,2}$, and $P_{3,2}$ (e.g., corner values) based on the following equations:

$$P_{1,2} = \mu + s\sigma_{cm} + \frac{1}{\sqrt{6}}k\sigma_{m0}, \quad (2.5a)$$

$$P_{2,2} = \mu + s\sigma_{cm} + \frac{1}{\sqrt{6}}k\sigma_{m0}, \quad (2.5b)$$

$$P_{3,2} = \mu + s\sigma_{cm} - \frac{2}{\sqrt{6}}k\sigma_{m0}. \quad (2.5c)$$

For the second circuit simulation run, the relation (2.3) holds, as an average of the parameters $P_{1,2}$, $P_{2,2}$, and $P_{3,2}$ is at the chip-mean corner point of $s\sigma_{cm}$. Mismatch values from the second circuit simulation run may be determined based on the following equations:

$$P_{1,2} - P_{2,2} = 0, \quad (2.6a)$$

$$P_{1,2} - P_{3,2} = \frac{3}{\sqrt{6}}k\sigma_{m0}, \quad (2.6b)$$

$$P_{2,2} - P_{3,2} = \frac{3}{\sqrt{6}}k\sigma_{m0}. \quad (2.6c)$$

Mismatch values from both the first and second circuit simulation may be determined based on the following equations:

$$\frac{1}{2}\sum_{l=1}^{2}(P_{1,l}-P_{2,l})^2 = \tag{2.7a}$$

$$\frac{1}{2}[(P_{1,1}-P_{2,1})^2+(P_{1,2}-P_{2,2})^2] = \frac{1}{2}2k^2\sigma_{m0}^2 = (k\sigma_{m0})^2,$$

$$\frac{1}{2}\sum_{l=1}^{2}(P_{1,l}-P_{3,l})^2 = \tag{2.7b}$$

$$\frac{1}{2}[(P_{1,1}-P_{3,1})^2+(P_{1,2}-P_{3,2})^2] = \frac{1}{2}\left(\frac{1}{2}+\frac{9}{6}\right)k^2\sigma_{m0}^2 = (k\sigma_{m0})^2,$$

$$\frac{1}{2}\sum_{l=1}^{2}(P_{2,l}-P_{3,l})^2 = \tag{2.7c}$$

$$\frac{1}{2}[(P_{2,1}-P_{3,1})^2+(P_{2,2}-P_{3,2})^2] = \frac{1}{2}\left(\frac{1}{2}+\frac{9}{6}\right)k^2\sigma_{m0}^2 = (k\sigma_{m0})^2.$$

Namely, as shown in the relations (2.7a), (2.7b), and (2.7c), the relation (2.1) is satisfied. In alternative or additional embodiments, the corner model tool 105 can determine other sets of corner values for the first-run parameters $P_{1,1}$, $P_{2,1}$, and $P_{3,1}$ and the second-run parameters $P_{1,2}$, $P_{2,2}$, and $P_{3,2}$ to achieve the relation (2.1). For example, for the first circuit simulation run, to achieve the equal adjacent mismatch value, the corner model tool 105 may determine and set the parameters $P_{1,1}$, $P_{2,1}$, and $P_{3,1}$ based on the following equations:

$$P_{1,1} = \mu + s\sigma_{cm} + \frac{1}{\sqrt{2}}k\sigma_{m0}\left(\cos\phi + \frac{1}{\sqrt{3}}\sin\phi\right), \tag{2.8a}$$

$$P_{2,1} = \mu + s\sigma_{cm} + \frac{1}{\sqrt{2}}k\sigma_{m0}\left(-\cos\phi + \frac{1}{\sqrt{3}}\sin\phi\right), \tag{2.8b}$$

$$P_{3,1} = \mu + s\sigma_{cm} + \frac{1}{\sqrt{2}}k\sigma_{m0}\left(-\frac{2}{\sqrt{3}}\sin\phi\right), \tag{2.8c}$$

where $\Phi$ an arbitrary angle value.

For the first circuit simulation run, the relation (2.3) holds, as an average of the parameters $P_{1,1}$, $P_{2,1}$, and $P_{3,1}$ is at the chip-mean corner point of $s\sigma_{cm}$. Mismatch values from the first circuit simulation run can be determined based on the following equations:

$$P_{1,1} - P_{2,1} = \sqrt{2}\,k\sigma_{m0}\cos\phi, \tag{2.9a}$$

$$P_{1,1} - P_{3,1} = \frac{1}{\sqrt{2}}k\sigma_{m0}(\cos\phi + \sqrt{3}\sin\phi), \tag{2.9b}$$

$$P_{2,1} - P_{3,1} = \frac{1}{\sqrt{2}}k\sigma_{m0}(-\cos\phi + \sqrt{3}\sin\phi). \tag{2.9c}$$

For the second circuit simulation run, to achieve the equal adjacent mismatch value, the corner model tool 105 can determine and set the parameters $P_{1,2}$, $P_{2,2}$, and $P_{3,2}$ based on the following equations:

$$P_{1,2} = \mu + s\sigma_{cm} + \frac{1}{\sqrt{2}}k\sigma_{m0}\left(-\sin\phi + \frac{1}{\sqrt{3}}\cos\phi\right), \tag{2.10a}$$

$$P_{2,2} = \mu + s\sigma_{cm} + \frac{1}{\sqrt{2}}k\sigma_{m0}\left(\sin\phi + \frac{1}{\sqrt{3}}\cos\phi\right), \tag{2.10b}$$

$$P_{3,2} = \mu + s\sigma_{cm} + \frac{1}{\sqrt{2}}k\sigma_{m0}\left(-\frac{2}{\sqrt{3}}\cos\phi\right). \tag{2.10c}$$

Again, for the second circuit simulation run, the relation (2.3) holds, as an average of the parameters $P_{1,2}$, $P_{2,2}$, and $P_{3,2}$ is at the chip-mean corner point of $s\sigma_{cm}$. Mismatch values from the second circuit simulation run can be determined based on the following equations:

$$P_{1,2} - P_{2,2} = -\sqrt{2}\,k\sigma_{m0}\sin\phi, \tag{2.11a}$$

$$P_{1,2} - P_{3,2} = \frac{1}{\sqrt{2}}k\sigma_{m0}(-\sin\phi + \sqrt{3}\cos\phi), \tag{2.11b}$$

$$P_{2,2} - P_{3,2} = \frac{1}{\sqrt{2}}k\sigma_{m0}(\sin\phi + \sqrt{3}\cos\phi). \tag{2.11c}$$

Mismatch values from both the first and second circuit simulation may be determined based on the following equations:

$$\frac{1}{2}\sum_{l=1}^{2}(P_{1,l}-P_{2,l})^2 = \tag{2.12a}$$

$$\frac{1}{2}[(P_{1,1}-P_{2,1})^2+(P_{1,2}-P_{2,2})^2] = \frac{1}{2}2k^2\sigma_{m0}^2 = (k\sigma_{m0})^2,$$

$$\frac{1}{2}\sum_{l=1}^{2}(P_{2,l}-P_{3,l})^2 = \tag{2.12b}$$

$$\frac{1}{2}[(P_{1,1}-P_{3,1})^2+(P_{1,2}-P_{3,2})^2] = \frac{1}{2}\cdot\frac{1}{2}4k^2\sigma_{m0}^2 = (k\sigma_{m0})^2,$$

$$\frac{1}{2}\sum_{l=1}^{2}(P_{2,l}-P_{3,l})^2 = \tag{2.12c}$$

$$\frac{1}{2}[(P_{2,1}-P_{3,1})^2+(P_{2,2}-P_{3,2})^2] = \frac{1}{2}\cdot\frac{1}{2}4k^2\sigma_{m0}^2 = (k\sigma_{m0})^2.$$

Once again, as shown in the relations (2.12a), (2.12b), and (2.12c), the relation (2.1) is satisfied. In general, for the $l^{th}$ circuit simulation run using the (N−1)-run corner model for mismatch between three devices, to achieve the equal adjacent mismatch value, the corner model tool 105 can determine and set the parameter $P_{i,l}$ (e.g., corner value) for an $i^{th}$ device based on the following equation:

$$P_{i,l} = \mu + s\sigma_{cm} + k\sigma_{m0}t_{i,l},\ i=1,2,3, l=1,2, \tag{2.13}$$

where $t_{i,l}$ is a predetermined mismatch corner value.

Substitution of the equation (2.13) into the equation (2.1) leads to the following equation:

$$\frac{1}{2}\sum_{l=1}^{2}(t_{i,l}-t_{j,l})^2 = 1,\ i, j = 1, 2, 3, i \neq j. \tag{2.14}$$

The mismatch corner values $t_{i,l}$ can be predetermined such that they satisfy the relation (2.14). For example, one set of the mismatch corner values $t_{i,l}$ are shown in the equations (2.2a)-(2.2c) and (2.5a)-(2.5c), and are in shown the following matrix T:

$$T_{3\times 2} = [t_{i,l}]_{3\times 2} = \pm \begin{pmatrix} \frac{1}{\sqrt{2}} & \frac{1}{\sqrt{6}} \\ -\frac{1}{\sqrt{2}} & \frac{1}{\sqrt{6}} \\ 0 & -\frac{2}{\sqrt{6}} \end{pmatrix}. \quad (2.15)$$

In embodiments, in a (N−1)-run corner model for mismatch between four devices, to achieve an equal adjacent mismatch value of $k\sigma_{m0}$ among six pairs from four devices simultaneously, the corner model tool 105 can perform (N−1) or 3 circuit simulation runs, instead of a single circuit simulation run. The equal adjacent mismatch value of $k\sigma_{m0}$ among six pairs from four devices may be achieved, as shown in the following equation:

$$\frac{1}{3}\sum_{l=1}^{3}(P_{i,l}-P_{j,l})^2 = (k\sigma_{m0})^2,\ i,j=1,2,3,4,\ i\neq j. \quad (3.1)$$

In general, for the $l^{th}$ circuit simulation run using the (N−1)-run corner model for mismatch between four devices, to achieve the equal adjacent mismatch value, the corner model tool 105 can determine and set the parameter $P_{i,l}$ (e.g., corner value) for an $i^{th}$ device based on the following equation:

$$P_{i,l} = \mu + s\sigma_{cm} + k\sigma_{m0}t_{i,l},\ i=1,2,3,4,\ l=1,2,3. \quad (3.2)$$

Substitution of the equation (3.2) into the equation (3.1) leads to the following equation:

$$\frac{1}{3}\sum_{l=1}^{3}(t_{i,l}-t_{j,l})^2 = 1,\ i,j=1,2,3,4,\ i\neq j. \quad (3.3)$$

There are many sets of mismatch corner values for a first circuit simulation run (e.g., mismatch corner values $t_{1,1}$, $t_{2,1}$, $t_{3,1}$, $t_{4,1}$), a second circuit simulation run (e.g., mismatch corner values $t_{1,2}$, $t_{2,2}$, $t_{3,2}$, $t_{4,2}$), and a third circuit simulation run (e.g., mismatch corner values $t_{1,3}$, $t_{2,3}$, $t_{3,3}$, $t_{4,3}$) to achieve the relation (3.3). For example, one set of the mismatch corner values $t_{i,l}$ are shown in the following matrix T:

$$T_{4\times 3} = [t_{i,l}]_{4\times 3} = \pm\sqrt{\frac{3}{2}}\begin{pmatrix} \frac{1}{\sqrt{2}} & \frac{1}{\sqrt{6}} & \frac{1}{\sqrt{12}} \\ -\frac{1}{\sqrt{2}} & \frac{1}{\sqrt{6}} & \frac{1}{\sqrt{12}} \\ 0 & -\frac{2}{\sqrt{6}} & \frac{1}{\sqrt{12}} \\ 0 & 0 & -\frac{3}{\sqrt{12}} \end{pmatrix}. \quad (3.4)$$

A sum of all values in any column of the matrix T is zero, as shown in the following equation:

$$\sum_{i=1}^{4} t_{i,l} = 0,\ l=1,2,3. \quad (3.5)$$

This means that for any of the three circuit simulation runs, an average of the parameters $P_1$, $P_2$, $P_3$, and $P_4$ is at the chip-mean corner point of $s\sigma_{cm}$, as shown in the following equation:

$$\frac{1}{4}(P_1+P_2+P_3+P_4) = \mu + s\sigma_{cm}. \quad (3.6)$$

This further verifies that the set of mismatch corner values in equation (3.4) satisfy the relation (3.3). To determine other sets of mismatch corner values $t_{i,l}$, the corner model tool 105 can exchange mismatch corner values of a pair of devices. The corner model tool 105 may further determine the other sets of mismatch corner values $t_{i,l}$ based on the following matrix $\hat{T}$:

$$\hat{T}_{4\times 3} = [\hat{t}_{i,l}]_{4\times 3} = \quad (3.7)$$

$$\pm\sqrt{\frac{3}{2}}\begin{pmatrix} \frac{1}{\sqrt{2}}\cos\phi+\frac{1}{\sqrt{6}}\sin\phi & \left(-\frac{1}{\sqrt{2}}\sin\varphi+\frac{1}{\sqrt{6}}\cos\varphi\right)\cos\theta+\frac{1}{\sqrt{12}}\sin\theta & \left(\frac{1}{\sqrt{2}}\sin\varphi-\frac{1}{\sqrt{6}}\cos\varphi\right)\sin\theta+\frac{1}{\sqrt{12}}\cos\theta \\ -\frac{1}{\sqrt{2}}\cos\phi+\frac{1}{\sqrt{6}}\sin\phi & \left(\frac{1}{\sqrt{2}}\sin\varphi+\frac{1}{\sqrt{6}}\cos\varphi\right)\cos\theta+\frac{1}{\sqrt{12}}\sin\theta & -\left(\frac{1}{\sqrt{2}}\sin\varphi+\frac{1}{\sqrt{6}}\cos\varphi\right)\sin\theta+\frac{1}{\sqrt{12}}\cos\theta \\ -\frac{2}{\sqrt{6}}\sin\phi & -\frac{2}{\sqrt{6}}\cos\varphi\cos\theta+\frac{1}{\sqrt{12}}\sin\theta & \frac{2}{\sqrt{6}}\cos\varphi\sin\theta+\frac{1}{\sqrt{12}}\cos\theta \\ 0 & -\frac{3}{\sqrt{12}}\sin\theta & -\frac{3}{\sqrt{12}}\cos\theta \end{pmatrix},$$

where $\Phi$ and $\theta$ are arbitrary angle values.

In embodiments, in a (N−1)-run corner model for mismatch between N devices, to achieve an equal adjacent mismatch value of $k\sigma_{m0}$ among N(N−1)/2 pairs from N devices simultaneously, the corner model tool 105 can perform (N−1) circuit simulation runs, instead of a single circuit simulation run. The equal adjacent mismatch value of $k\sigma_{m0}$ among N(N−1)/2 pairs from N devices may be achieved, as shown in the following equation:

$$\frac{1}{N-1}\sum_{l=1}^{N-1}(P_{i,l} - P_{j,l})^2 = (k\sigma_{m0})^2, \quad (4.1)$$
$$i, j = 1, 2, 3, \ldots, N, i \neq j.$$

In general, for the $l^{th}$ circuit simulation run using the (N−1)-run corner model for mismatch between N devices, to achieve the equal adjacent mismatch value, the corner model tool 105 can determine and set the parameter $P_{i,l}$ (e.g., corner value) for an $i^{th}$ device based on the following equation:

$$P_{i,l} = \mu + s\sigma_{cm} + k\sigma_{m0} t_{i,l}, \; i=1,2,3,\ldots,N, \; l=1,2,3,\ldots, N-1. \quad (4.2)$$

Substitution of the equation (4.2) into the relation (4.1) leads to the following equation:

$$\frac{1}{N-1}\sum_{l=1}^{N-1}(t_{i,l} - t_{j,l})^2 = 1, \; i, j = 1, 2, 3, \ldots, N, i \neq j. \quad (4.3)$$

There are many sets of mismatch corner values $t_{i,l}$ for (N−1) circuit simulation runs to achieve the relation (4.3). They all have the following properties: mismatch corner values $t_{i,l}$ are based on the number N of the devices; at least two of the N devices in a given simulation use different corner values; and mismatch corner values for one simulation run are different from mismatch corner values for a next simulation run. For example, one set of the mismatch corner values $t_{i,l}$ are shown in the following matrix $T_{N \times (N-1)}$:

$$T_{N \times (N-1)} = [t_{i,l}]_{N \times (N-1)} = \pm\sqrt{\frac{N-1}{2}} \quad (4.4)$$

$$\begin{pmatrix} \frac{1}{\sqrt{2 \cdot 1}} & \frac{1}{\sqrt{3 \cdot 2}} & \frac{1}{\sqrt{4 \cdot 3}} & \cdots & \frac{1}{\sqrt{N(N-1)}} \\ -\frac{2-1}{\sqrt{2 \cdot 1}} & \frac{1}{\sqrt{3 \cdot 2}} & \frac{1}{\sqrt{4 \cdot 3}} & \cdots & \frac{1}{\sqrt{N(N-1)}} \\ 0 & -\frac{3-1}{\sqrt{3 \cdot 2}} & \frac{1}{\sqrt{4 \cdot 3}} & \cdots & \frac{1}{\sqrt{N(N-1)}} \\ \vdots & \vdots & \vdots & \ddots & \vdots \\ 0 & 0 & 0 & \cdots & -\frac{1}{\sqrt{N(N-1)}} \end{pmatrix},$$

Namely, the mismatch corner values $t_{i,l}$ are:

$$t_{i,i-1} = \mp\sqrt{\frac{N-1}{2}} \frac{i-1}{\sqrt{i(i-1)}} = \mp\sqrt{\frac{(N-1)(i-1)}{2i}}, \quad (4.5a)$$
$$i = 2, 3, \ldots, N;$$

$$t_{i,l} = 0, \; i = 3, 4, \ldots, N, i > l+1; \quad (4.5b)$$

$$t_{i,l} = \pm\sqrt{\frac{N-1}{2}} \frac{i-1}{\sqrt{(l+1)l}}, \; l = 1, 2, 3, \ldots, N-1, i \leq l. \quad (4.5c)$$

A sum of all values in any column of the matrix $T_{N \times (N-1)}$ is zero, as shown in the following equation:

$$\sum_{i=1}^{N} t_{i,l} = 0, \; l = 1, 2, 3, \ldots, N-1. \quad (4.6a)$$

This means that for any of the (N−1) circuit simulation runs, an average of the N parameters $P_i$ is at the chip-mean corner point of $s\sigma_{cm}$, as shown in the following equation:

$$\frac{1}{N}\sum_{i=1}^{N} P_i = \mu + s\sigma_{cm}. \quad (4.6b)$$

Using the mismatch corner values $t_{i,l}$ in equations (4.5a)-(4.5c), it can be verified that the N(N−1)/2 relations (4.3) are all satisfied.

The corner model tool 105 may exchange or rearrange the rows of matrix $T_{N \times (N-1)}$, to determine equivalent mismatch corner models. More generally, the mismatch corner values $t_{i,l}$ can be determined from the equation below:

$$T_{N \times N} = [t_{i,l-1}]_{N \times N} = A_{N \times N} B_{N \times N} A_{N \times N}^T, \quad (4.7)$$

$$B_{N \times N} = $$

$$\pm\sqrt{\frac{N-1}{2}} \begin{pmatrix} 0 & \frac{1}{\sqrt{2 \cdot 1}} & \frac{1}{\sqrt{3 \cdot 2}} & \frac{1}{\sqrt{4 \cdot 3}} & \cdots & \frac{1}{\sqrt{N(N-1)}} \\ 0 & -\frac{2-1}{\sqrt{2 \cdot 1}} & \frac{1}{\sqrt{3 \cdot 2}} & \frac{1}{\sqrt{4 \cdot 3}} & \cdots & \frac{1}{\sqrt{N(N-1)}} \\ 0 & 0 & -\frac{3-1}{\sqrt{3 \cdot 2}} & \frac{1}{\sqrt{4 \cdot 3}} & \cdots & \frac{1}{\sqrt{N(N-1)}} \\ \vdots & \vdots & \vdots & \vdots & \ddots & \vdots \\ 0 & 0 & 0 & 0 & \cdots & -\frac{1}{\sqrt{N(N-1)}} \end{pmatrix},$$

where $A_{N \times N}$ is a matrix satisfying $A_{N \times N} A_{N \times N}^T = I_{N \times N}$.

When the N-run process is determined to be performed, the corner model tool 105 can determine N-run corner values (e.g., electrical parameters P) of the semiconductor devices 110 based on an N-run corner model for device mismatch that requires N circuit simulation runs, where N is greater than or equal to 2. The N-run process simplifies resulting mismatch corner values, as discussed herein, for a cost of one more circuit simulation run than the (N−1)-run process. For example, a N-run corner model for mismatch between N adjacent and approximately identical devices may desire to achieve a mismatch value of $k\sigma_{m0}$, as shown in the following equation:

$$\frac{1}{N}\sum_{l=1}^{N}(P_{i,l}-P_{j,l})^2 = (k\sigma_{m0})^2, \, i, j = 1, 2, 3, \ldots, N, \, i \neq j. \quad (5.1)$$

In general, for the $l^{th}$ circuit simulation run using the N-run corner model for mismatch between N devices, to achieve the equal adjacent mismatch value, the corner model tool 105 can determine and set the parameter $P_{i,l}$ (e.g., corner value) for an $i^{th}$ device based on the following equation:

$$P_{i,l} = \mu + s\sigma_{cm} + k\sigma_{m0}u_{i,l}, \, i,l=1,2,3,\ldots,N, \quad (5.2)$$

where $u_{i,l}$ is a predetermined mismatch corner value.

Substitution of the equation (5.2) into the relation (5.1) leads to the following equation:

$$\frac{1}{N}\sum_{l=1}^{N}(u_{i,l}-u_{j,l})^2 = 1, \, i, j = 1, 2, 3, \ldots, N, \, i \neq j. \quad (5.3)$$

There are many sets of mismatch corner values $u_{i,l}$ for N circuit simulation runs to achieve the relation (5.3). For example, one set of the mismatch corner values $u_{i,l}$ are shown in the following N×N matrix U:

$$U = [u_{i,l}]_{N\times N} = \sqrt{\frac{N}{2}} \begin{pmatrix} \pm 1 & 0 & 0 & \ldots & 0 \\ 0 & \pm 1 & 0 & \ldots & 0 \\ 0 & 0 & \pm 1 & \ldots & 0 \\ \vdots & \vdots & \vdots & \ddots & \vdots \\ 0 & 0 & 0 & \ldots & \pm 1 \end{pmatrix}. \quad (5.4)$$

Namly, mismatch corner values $u_{i,l}$ are:

$$u_{i,l} = \pm \delta_{i,l}\sqrt{N/2}, \, i,l=1,2,3,\ldots,N. \quad (5.5)$$

Using the mismatch corner values $u_{i,l}$ in equations (5.5), it can be verified that the N(N−1)/2 relations (5.3) are all satisfied.

The corner model tool 105 may exchange or rearrange the rows of matrix $U_{N\times N}$, to determine equivalent mismatch corner models. The corner model tool 105 may further determine other sets of mismatch corner values $u_{i,l}$ using a unitary matrix transformation to the matrix in equation. (5.4). For example, the mismatch corner values $u_{i,l}$ can be expressed in terms of the following N×N matrix U:

$$U = [u_{i,l}]_{N\times N} = \sqrt{\frac{N}{2}} \begin{pmatrix} \cos\phi & -\cos\theta\sin\phi & \sin\theta\sin\phi & \ldots & 0 \\ \sin\phi & \cos\theta\cos\phi & -\sin\theta\cos\phi & \ldots & 0 \\ 0 & \sin\theta & \cos\theta & \ldots & 0 \\ \vdots & \vdots & \vdots & \ddots & \vdots \\ 0 & 0 & 0 & \ldots & \pm 1 \end{pmatrix}, \quad (5.6)$$

where $\Phi$ and $\theta$ are arbitrary angle values. More generally, the mismatch corner values $u_{i,l}$ can be expressed in terms of the following N×N matrix U:

$$U = [u_{i,l}]_{N\times N} = \sqrt{\frac{N}{2}} A \begin{pmatrix} \pm 1 & 0 & 0 & \ldots & 0 \\ 0 & \pm 1 & 0 & \ldots & 0 \\ 0 & 0 & \pm 1 & \ldots & 0 \\ \vdots & \vdots & \vdots & \ddots & \vdots \\ 0 & 0 & 0 & \ldots & \pm 1 \end{pmatrix} A^T, \quad (5.7)$$

where A is an N×N matrix satisfying $AA^T=I$.

Once corner values of a respective (N−1) or N corner model are determined, the corner model tool 105 can run (N−1) or N circuit simulations (e.g., corner simulations) based on the determined corner values of the (N−1) or N corner model:

$$F_{i,l} = f(P_{i,l}, Q_i, R_i, S_i, \ldots), \, i=1,2,3,\ldots,N, \, l=1,2,3,\ldots, \\ L, \, L=N-1 \text{ or } N. \quad (6.1)$$

More specifically, in embodiments, the corner model tool 105 may post-process one or more simulation results of the Monte Carlo simulations and/or the corner simulations to determine statistical information (e.g., standard deviations and/or mismatch corner values) for mismatches (e.g., differences) between other parameters of the semiconductor devices 110 (e.g., time delays, drain currents, etc.). The mismatch among the electric performance targets $F_1, F_2, \ldots, F_N$ may be determined based on the simulation results. For example, the corner model tool 105 may run the following post-processing step:

$$\langle(F_i-F_j)^2\rangle_{corner} = \frac{1}{L}\sum_{l=1}^{L}(F_{i,l}-F_{j,l})^2, \quad (6.2)$$

$$i, j = 1, 2, 3, \ldots, N, \, i \neq j, \, L = N-1 \text{ or } N.$$

where L is a number (N−1) or N of the circuit simulations, $F_{i,l}$ is a value of a performance target $_i$ of the $i^{th}$ device in an $l^{th}$ simulation, and $F_{j,l}$ is a value of a performance target $F_j$ of the $j^{th}$ device in the $l^{th}$ simulation.

Resulting N(N−1)/2 pairs of mismatch among $F_1, F_2, \ldots, F_N$ have desired k-sigma corner values simultaneously. This statement is further explained below. To the leading order, it follows from Eq. (1.0) that $$F_i - F_j = a(P_i - P_j), \, i,j=1,2,3,\ldots,N, \quad (6.3)$$

where a is a sensitivity of the electric performance target F with respect to statistical model parameter P.

The value of sensitivity a depends on voltages and/or time, etc. and is unknown before a circuit simulation in general. The mismatch between a pair of electric performance targets $F_i$ and $F_j$ is thus found to be proportional to the mismatch between a corresponding pair of statistical model parameters $P_i$ and $P_j$:

$$\langle(F_i-F_j)^2\rangle = a^2 \langle(P_i-P_j)^2\rangle = (a\sigma_{m0})^2, \, i,j=1,2,3,\ldots, \\ N, \, i\neq j, \quad (6.4)$$

where Eq. (1.3) is used. Using Eqs. (6.2) and (6.3), we now see clearly that N(N−1)/2 pairs of mismatch among $F_1, F_2, \ldots, F_N$ have desired k-sigma corner values simultaneously, $$\langle(F_i-F_j)^2\rangle_{corner} = \frac{1}{L}\sum_{l=1}^{L}(F_{i,l}-F_{j,l})^2 = \quad (6.5)$$

-continued $$\frac{a^2}{L}\sum_{l=1}^{L}(P_{i,l}-P_{j,l})^2 = a^2(k\sigma_{m0})^2 = k^2(a\sigma_{m0})^2,$$

$i, j = 1, 2, 3, \ldots, N, i \neq j,$ where L is a number (N−1) or N circuit simulation runs.

Advantageously, the corner model tool 105 can more efficiently simulate device mismatch in an integrated circuit by running only (N−1) or N circuit simulations based on a respective device mismatch corner model, instead of running up to tens of thousands of circuit simulations based on a Monte Carlo model. In addition, by running more than one circuit simulation, the corner model tool 105 may achieve a mismatch value of $k\sigma_{m0}$ among N(N−1)/2 pairs from N adjacent and approximately identical devices simultaneously, where N is greater than 2. Accordingly, the corner model tool 105 may minimize circuit simulation time and resources required to determine the effect of random device mismatch on circuit performance.

The computing device 14 can comprise any general purpose computing article of manufacture capable of executing computer program code installed thereon (e.g., a personal computer, server, etc.). However, it is understood that the computing device 14 is only representative of various possible equivalent-computing devices that may perform the processes described herein. To this extent, in embodiments, the functionality provided by the computing device 14 can be implemented by a computing article of manufacture that includes any combination of general and/or specific purpose hardware and/or computer program code. In each embodiment, the program code and hardware can be created using standard programming and engineering techniques, respectively.

Similarly, the computing infrastructure 12 is only illustrative of various types of computer infrastructures for implementing the invention. For example, in embodiments, the server 12 comprises two or more computing devices (e.g., a server cluster) that communicate over any type of communications link, such as a network, a shared memory, or the like, to perform the process described herein. Further, while performing the processes described herein, one or more computing devices on the server 12 can communicate with one or more other computing devices external to the server 12 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

Figure 2:
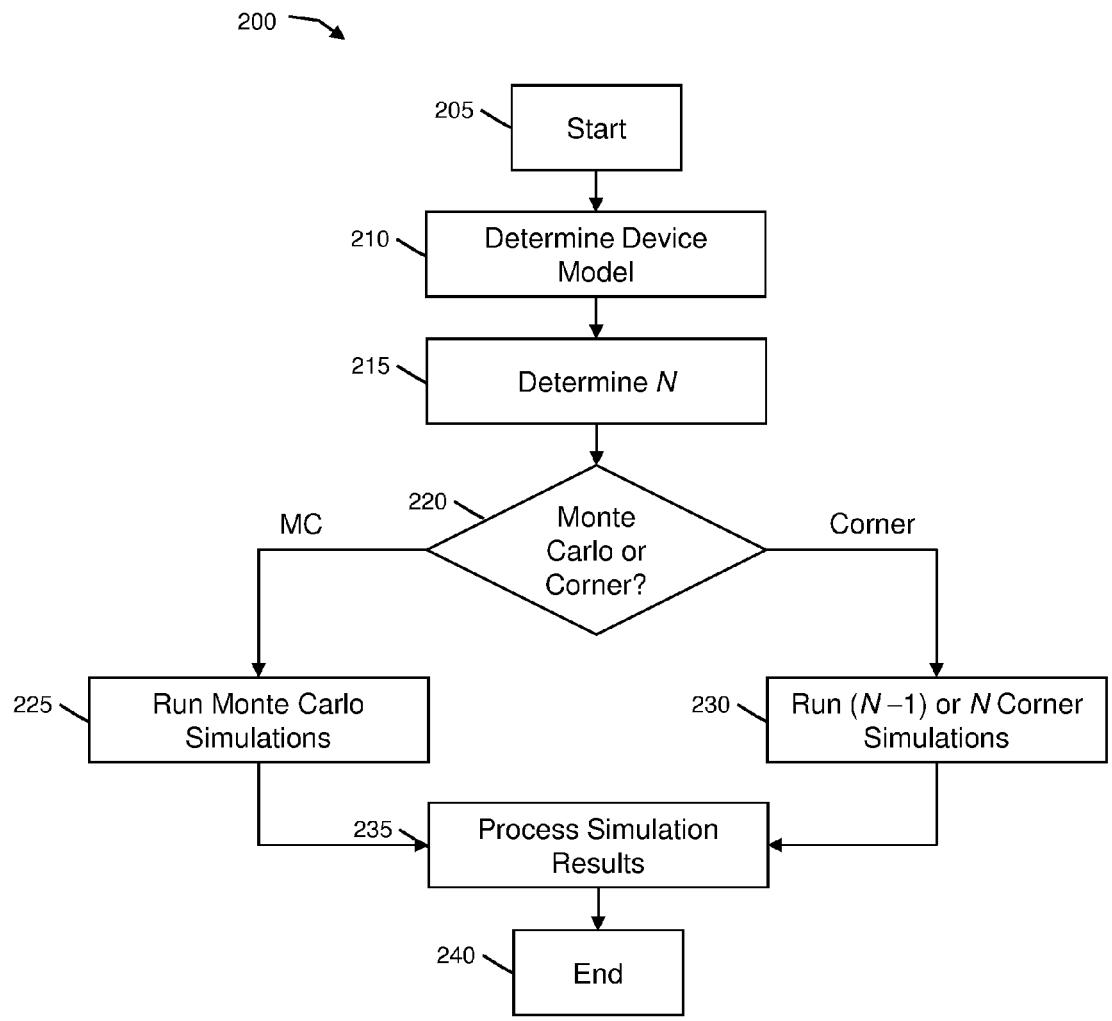
FIGS. 2-4 are exemplary flow diagrams of processes of providing a device mismatch corner model for semiconductor device simulation in accordance with aspects of the invention.
Figure 3:
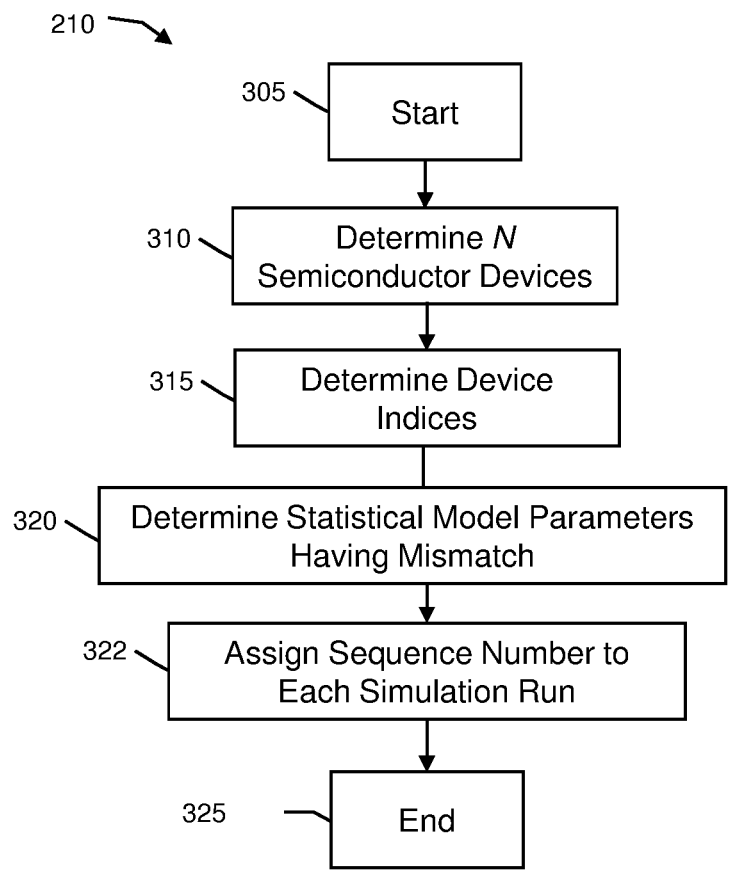
Figure 4:
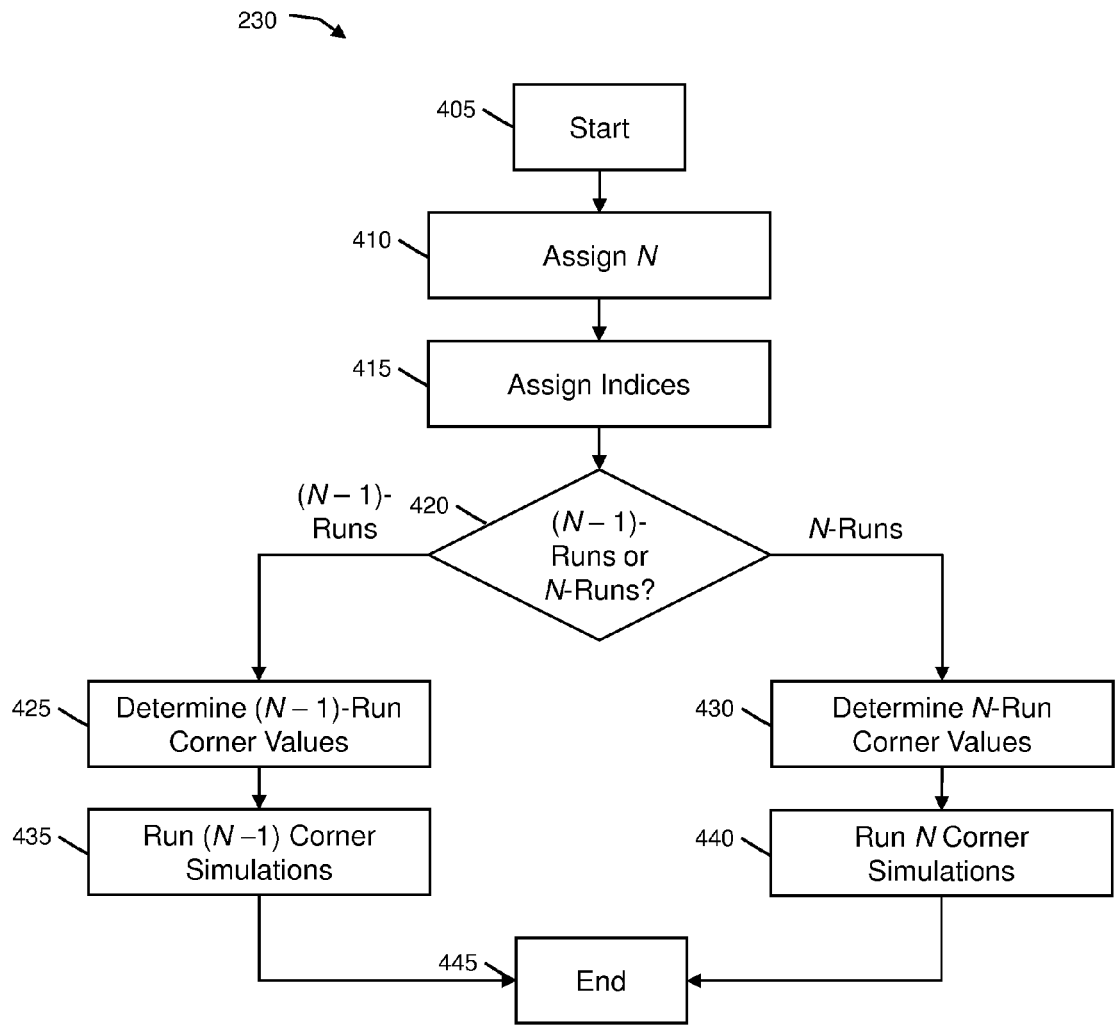

FIGS. 2-4 show an exemplary flow for performing aspects of the present invention. The steps of FIGS. 2-4 may be implemented in the environment of FIG. 1, for example. The flowcharts and block diagrams in the Figures illustrate the architecture, functionality, and operation of possible implementations of systems, methods and computer program products according to various embodiments of the present invention. In this regard, each block in the flowcharts or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

Furthermore, the invention can take the form of a computer program product accessible from a computer-usable or computer-readable medium providing program code for use by or in connection with a computer or any instruction execution system. The software and/or computer program product can be implemented in the environment of FIG. 1. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable storage medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disc-read/write (CD-R/W) and DVD.

FIG. 2 depicts an exemplary flow for a process 200 of providing a device mismatch corner model for semiconductor device simulation in accordance with aspects of the invention. In embodiments, the process 200 can be performed by the corner model tool 105 in FIG. 1. At step 205, the process starts. At step 210, the corner model tool determines a device model, e.g., a SPICE (Simulation Program with Integrated Circuit Emphasis) model, a FET model, a resistor model, a capacitor model, etc., of semiconductor devices to be simulated. In embodiments, the device model may be determined based on input data from a circuit designer with knowledge of a circuit and mismatches between the semiconductor devices.

At step 215, once the device model is determined, the corner model tool determines a number N of the semiconductor devices for circuit simulation based on the device model. At step 220, the corner model tool determines whether to run Monte Carlo simulations or corner (model) simulations based on the received input data. When the Monte Carlo simulations are determined to be run, the process continues at step 225. Otherwise, the process continues at step 230.

At step 225, the corner model tool runs the Monte Carlo simulations. In embodiments, the running of the Monte Carlo simulations can include determining electrical parameters (e.g., currents, resistances, capacitances, etc.) of the semiconductor devices based on a Monte Carlo model, and running up to tens of thousands of circuit simulations based on the determined electrical parameters. At step 230, the corner model runs (N−1) or N corner simulations. In embodiments, the running of the corner simulations may include determining electrical parameters (e.g., corner values) of the semiconductor devices based on an (N−1) or N corner model, and running (N−1) or N circuit simulations based on the determined corner values. The determined corner values may represent extreme values for the respective electrical parameters of interest. The corner model used (e.g., the (N−1) or N corner model) may be dependent on the number N of the semiconductor devices which are to have mismatched electrical parameters.

At step 235, the corner model tool processes one or more simulation results of the Monte Carlo simulations and/or the corner simulations to determine statistical information (e.g., standard deviations and/or mismatch corner values) for mismatches (e.g., differences) between other parameters of the semiconductor devices 110 (e.g., time delays, drain currents, etc.). The other parameters can be determined based on the simulation results. At step 240, the process ends.

FIG. 3 depicts an exemplary flow for a process of the step 210 in FIG. 2 of determining the device model in accordance with aspects of the invention. In embodiments, the process can be performed by the corner model tool 105 in FIG. 1. At step 305, the process starts. At step 310, based on input data from, e.g., a circuit designer, the corner model tool determines a number N of adjacent and approximately identical semiconductor devices in a group, where correlations (e.g., mismatches) among the N semiconductor devices affect circuit performance and are thus, being simulated and evaluated for the particular circuit.

At step 315, further based on the input data, the corner model tool determines one or more indices for the semiconductor devices of the device model. Each of the indices may indicate a sequence of each of the semiconductor devices. For example, an index "1" may be determined for a first device, an index "2" may be determined for a second device, and so on. At step 320, further based on the input data, the corner model tool determines one or statistical model more parameters (e.g., currents, resistances, capacitances, and/or channel lengths) pertinent for the semiconductor devices of the device model, e.g., having mismatch. These parameters (e.g., $P_1$, $P_2$, and $P_N$) may be used for determining and simulating the device mismatch corner model. At step 322, the corner model tool assigns a sequence number to each simulation run. At step 325, the process ends.

FIG. 4 depicts an exemplary flow for a process of the step 230 in FIG. 2 in accordance with aspects of the invention. In embodiments, the process can be performed by the corner model tool 105 in FIG. 1. At step 405, the process starts. At step 410, the corner model tool assigns a number N of adjacent and approximately identical semiconductor devices in a group, to each of the semiconductor devices in the group. In embodiments, for a semiconductor device which is not in the group of the semiconductor devices, the corner model tool can assign the number "1" to the semiconductor device.

At step 415, the corner model tool assigns one or more indices to the respective semiconductor devices in the group. Each of the indices may indicate a sequence of each of the semiconductor devices. For example, an index "1" may be assigned to a first device of the semiconductor devices, an index "2" may be assigned to a second device of the semiconductor devices, and so on. At step 420, the corner model tool determines whether to perform a (N−1)-run process or an N-run process, for determining and simulating a corner model, based on the received input from, e.g., a circuit designer. When the (N−1)-run process is determined to be performed, the process continues at step 425. Otherwise, the process continues at step 430.

At step 425, the corner model tool determines (N−1)-run corner values (e.g., electrical parameters P) of the semiconductor devices based on a respective (N−1)-run corner model for device mismatch. For example, in a (N−1)-run corner model for mismatch between N devices, to achieve an equal adjacent mismatch value among N(N−1)/2 pairs from N devices simultaneously, the corner model tool can perform (N−1) circuit simulation runs. For the $l^{th}$ circuit simulation run, the corner model tool may determine and set a parameter $P_{i,l}$ (e.g., corner value) for an $i^{th}$ device based on the equations (4.2) and (4.5a)-(4.5c).

At step 430, the corner model tool determines N-run corner values (e.g., electrical parameters P) of the semiconductor devices based on an N-run corner model for device mismatch, where N is greater than or equal to 2. The N-run process simplifies resulting mismatch corner values for a cost of one more circuit simulation run than the (N−1)-run process. For example, in a N-run corner model for mismatch between N adjacent and approximately identical devices, to achieve an equal adjacent mismatch value among N(N−1)/2 pairs from N devices simultaneously, the corner model tool can perform N circuit simulation runs. For the $l^{th}$ circuit simulation run, the corner model tool may determine and set a parameter $P_{i,l}$ (e.g., corner value) for an $i^{th}$ device based on the equations (5.2) and (5.5).

At step 435, the corner model tool runs (N−1) corner simulations (e.g., circuit simulations) based on the determined (N−1)-run corner values of the respective (N−1)-run corner model. At step 440, the corner model tool runs N corner simulations (e.g., circuit simulations) based on the determined N-run corner values of the respective N-run corner model. At step 445, the process ends.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method of providing a device mismatch corner model for semiconductor device simulation, comprising:
   selecting a type of electric performance target F for a type of device;
   determining a number N of semiconductor devices for which mismatches among electric performance targets of the semiconductor devices are simulated;
   determining a desired k-sigma mismatch corner value among N(N−1)/2 pairs of the electric performance targets;
   identifying at least one electric parameter P of the semiconductor devices that has a mismatch component and contributes to the mismatches among the electric performance targets of the semiconductor devices;
   determining a plurality of corner values for the at least one electrical parameter P;

running at most N circuit simulations based on the determined plurality of corner values which are recalculated for each of the circuit simulations; and post-processing results of the N circuit simulations to achieve simultaneous mismatch among N(N−1)/2 pairs of the electric performance targets, wherein at least the step of the running at most N circuit simulations is implemented on a processor.

2. The method of claim 1, wherein the type of device is at least one of a type of semiconductor device, a type of logic gate, and a type of integrated circuit.

3. The method of claim 1, wherein the type of electric performance target F is at least one of a drain current of a field-effect transistor (FET), a resistance of a resistor, a capacitance of a capacitor, an inductance of an inductor, an electric current of a diode, a delay of a ring oscillator, and a delay of a logic gate.

4. The method of claim 1, wherein the plurality of corner values is determined for the at most N circuit simulations based on the number N of the semiconductor devices and a selection of (N−1) or N circuit simulations.

5. The method of claim 4, wherein the plurality of corner values is determined for (N−1) circuit simulations based on the following equation:

$$P_{i,l} = \mu + s\sigma_{cm} + k\sigma_{m0} t_{i,l}, \; i=1,2,3,\ldots,N, \; l=1,2,3,\ldots,N-1,$$

where i is an $i^{th}$ device of the semiconductor devices, l is a $l^{th}$ circuit simulation of the (N−1) circuit simulations, $\mu$ is a predetermined mean value for the at least one electrical parameter P, s is a corner value for chip mean part of variations, $\sigma_{cm}$ is a standard deviation for chip mean part of variations, k is a desired mismatch corner value among electric performance targets $F_1, F_2, \ldots, F_N$, $\sigma_{m0}$ is a standard deviation for mismatch part of variations, and $t_{i,l}$ is a plurality of mismatch corner values.

6. The method of claim 5, further comprising using the plurality of mismatch corner values based on the number N of the semiconductor devices, assigning different corner values to at least two of the N devices in a given simulation, and varying corner values from one simulation run to a next simulation run, based on the following equations:

$$t_{i,i-1} = \mp \sqrt{\frac{N-1}{2}} \frac{i-1}{\sqrt{i(i-1)}} = \mp \sqrt{\frac{(N-1)(i-1)}{2i}},$$

$$i = 2, 3, \ldots, N;$$

$$t_{i,1} = 0, \; i = 3, 4, \ldots, N, \; i > 1+1;$$

$$t_{i,1} = \pm \sqrt{\frac{N-1}{2}} \frac{1}{\sqrt{(1+1)1}}, \; 1 = 1, 2, 3, \ldots, N-1, \; i \leq 1.$$

7. The method of claim 5, further comprising determining the plurality of mismatch corner values based on the number N of the semiconductor devices, assigning different corner values to at least two of the N devices in a given simulation, and varying corner values from one simulation run to a next simulation run, based on the following equations:

$$T_{N\times N} = [t_{i,l-1}]_{N\times N} = A_{N\times N} B_{N\times N} A^T_{N\times N},$$

$$B_{N\times N} =$$

$$\pm \sqrt{\frac{N-1}{2}} \begin{pmatrix} 0 & \frac{1}{\sqrt{2\cdot 1}} & \frac{1}{\sqrt{3\cdot 2}} & \frac{1}{\sqrt{4\cdot 3}} & \cdots & \frac{1}{\sqrt{N(N-1)}} \\ 0 & -\frac{2-1}{\sqrt{2\cdot 1}} & \frac{1}{\sqrt{3\cdot 2}} & \frac{1}{\sqrt{4\cdot 3}} & \cdots & \frac{1}{\sqrt{N(N-1)}} \\ 0 & 0 & -\frac{3-1}{\sqrt{3\cdot 2}} & \frac{1}{\sqrt{4\cdot 3}} & \cdots & \frac{1}{\sqrt{N(N-1)}} \\ \vdots & \vdots & \vdots & \vdots & \ddots & \vdots \\ 0 & 0 & 0 & 0 & \cdots & -\frac{1}{\sqrt{N(N-1)}} \end{pmatrix},$$

where $A_{N\times N}$ is a matrix satisfying $A_{N\times N} A^T_{N\times N} = I_{N\times N}$.

8. The method of claim 4, wherein the plurality of corner values is determined for N circuit simulations based on the following equations:

$$P_{i,l} = \mu + s\sigma_{cm} + k\sigma_{m0} u_{i,l}, \; i,l=1,2,3,\ldots,N,$$

where i is an $i^{th}$ device of the semiconductor devices, l is a $l^{th}$ circuit simulation of the N circuit simulations, $\mu$ is a predetermined mean value for the at least one electrical parameter P, s is a corner value for chip mean part of variations, $\sigma_{cm}$ is a standard deviation for chip mean part of variations, k is a desired mismatch corner value among electric performance targets $F_1, F_2, \ldots, F_N$, $\sigma_{m0}$ is a standard deviation for mismatch part of variations, and $u_{i,l}$ is a plurality of mismatch corner values.

9. The method of claim 8, further comprising using the plurality of mismatch corner values are based on the number N of the devices, assigning different corner values to at least two of the N devices in a given simulation, and varying corner values from one simulation run to a next simulation run, based on the following equations:

$$u_{i,l} = \pm \delta_{i,l} \sqrt{N/2}, \; i,l=1,2,3,\ldots,N.$$

10. The method of claim 8, further comprising using the plurality of mismatch corner values are based on the number N of the devices, assigning different corner values to at least two of the N devices in a given simulation, and varying corner values from one simulation run to a next simulation run, based on the following equations:

$$U = [u_{i,l}]_{N\times N} = \sqrt{\frac{N}{2}} A \begin{pmatrix} \pm 1 & 0 & 0 & \cdots & 0 \\ 0 & \pm 1 & 0 & \cdots & 0 \\ 0 & 0 & \pm 1 & \cdots & 0 \\ \vdots & \vdots & \vdots & \ddots & \vdots \\ 0 & 0 & 0 & \cdots & \pm 1 \end{pmatrix} A^T,$$

where A is an N×N matrix satisfying $AA^T = I$.

11. The method of claim 1, running simulations using the above corner values, based on the following equation:

$$F_{i,l} = f(P_{i,l}, Q_i, R_i, S_i, \ldots), \; i=1,2,3,\ldots,N, \; l=1,2,3,\ldots,L, \; L=N-1 \text{ or } N.$$

where L is a number (N−1) or N of the circuit simulations, and $F_{i,l}$ is a value of a performance target $F_i$ of an $i^{th}$ device in an simulation.

12. The method of claim 1, wherein the post-processing comprises determining a mismatch between the electric performance targets of an $i^{th}$ device and a $j^{th}$ device using the following equation:

$$\langle (F_i - F_j)^2 \rangle_{corner} = \frac{1}{L} \sum_{l=1}^{L} (F_{i,l} - F_{j,l})^2,$$

$$i, j = 1, 2, 3, \ldots, N, i \neq j, L = N - 1 \text{ or } N.$$

where L is a number (N−1) or N of the circuit simulations, $F_{i,l}$ is a value of a performance target $F_i$ of the $i^{th}$ device in an $l^{th}$ simulation, and $F_{j,l}$ is a value of a performance target $F_j$ of the $j^{th}$ device in the simulation.

13. A method for semiconductor device simulation, comprising:
   determining a number N of semiconductor devices which have mismatch in at least three respective parameters;
   determining a plurality of corner values for the at least three respective parameters; and
   running (N−1) circuit simulations based on the determined plurality of corner values which are recalculated for each of the circuit simulations,
   wherein at least the step of the running (N−1) circuit simulations is implemented on a processor; and
   the plurality of corner values is determined based on the following equation:

$$P_{i,l} = \mu + s\sigma_{cm} + k\sigma_{m0} t_{i,l}, \; i=1,2,3,\ldots,N, \; l=1,2,3,\ldots,N-1,$$

where i is an $i^{th}$ device of the semiconductor devices, l is a $l^{th}$ circuit simulation of the (N−1) circuit simulations, μ is a predetermined mean value for the at least three parameters, s is a corner value for chip mean part of variations, $\sigma_{cm}$ is a standard deviation for chip mean part of variations, k is a desired mismatch corner value among electric performance targets F1, F2, …, FN, $\sigma_{m0}$ is a standard deviation for mismatch part of variations, and $t_{i,l}$ is a plurality of mismatch corner values.

14. The method of claim 13, further comprising determining the plurality of mismatch corner values based on the number N of the semiconductor devices, assigning different corner values to at least two of the N devices in a given simulation, and varying corner values from one simulation run to a next simulation run, based on the following equations:

$$t_{i,i-1} = \mp \sqrt{\frac{N-1}{2}} \frac{i-1}{\sqrt{i(i-1)}} = \mp \sqrt{\frac{(N-1)(i-1)}{2i}},$$

$$i = 2, 3, \ldots, N;$$

$$t_{i,l} = 0, \; i+3, 4, \ldots, N, \; i > l+1;$$

$$t_{i,1} = \pm \sqrt{\frac{N-1}{2}} \frac{1}{\sqrt{(l+1)l}}, \; l = 1, 2, 3, \ldots, N-1, \; i \leq 1.$$

15. The method of claim 13, further comprising determining the plurality of mismatch corner values based on the number N of the semiconductor devices, assigning different corner values to at least two of the N devices in a given simulation, and varying corner values from one simulation run to a next simulation run, based on the following equations:

$$T_{N \times N} = [t_{i,l-1}]_{N \times N} = A_{N \times N} B_{N \times N} A^T_{N \times N},$$

$$B_{N \times N} = $$

$$\pm \sqrt{\frac{N-1}{2}} \begin{pmatrix} 0 & \frac{1}{\sqrt{2 \cdot 1}} & \frac{1}{\sqrt{3 \cdot 2}} & \frac{1}{\sqrt{4 \cdot 3}} & \cdots & \frac{1}{\sqrt{N(N-1)}} \\ 0 & -\frac{2-1}{\sqrt{2 \cdot 1}} & \frac{1}{\sqrt{3 \cdot 2}} & \frac{1}{\sqrt{4 \cdot 3}} & \cdots & \frac{1}{\sqrt{N(N-1)}} \\ 0 & 0 & -\frac{3-1}{\sqrt{3 \cdot 2}} & \frac{1}{\sqrt{4 \cdot 3}} & \cdots & \frac{1}{\sqrt{N(N-1)}} \\ \vdots & \vdots & \vdots & \vdots & \ddots & \vdots \\ 0 & 0 & 0 & 0 & \cdots & -\frac{1}{\sqrt{N(N-1)}} \end{pmatrix},$$

where $A_{N \times N}$ is a matrix satisfying $A_{N \times N} A^T_{N \times N} = I_{N \times N}$.

16. A method for semiconductor device simulation, comprising:
   determining a number N of semiconductor devices which have mismatch in at least three respective parameters;
   determining a plurality of corner values for the at least three respective parameters; and
   running (N−1) circuit simulations based on the determined plurality of corner values which are recalculated for each of the circuit simulations,
   wherein at least the step of the running (N−1) circuit simulations is implemented on a processor; and
   running (N−1) circuit simulations using the above corner values, based on the following equation:

$$F_{i,l} = f(P_{i,l}, Q_i, R_i, S_i, \ldots), \; i=1,2,3,\ldots,N, \; l=1,2,3,\ldots,N-1,$$

where $F_{i,l}$ is a value of a performance target $F_i$ of an device in an $l^{th}$ simulation.

17. The method of claim 13, further comprising processing one or more results of the (N−1) circuit simulations to determine one or more worst-case effects of the mismatch of the semiconductor devices.

18. A method for semiconductor device simulation, comprising:
   determining a number N of semiconductor devices which have mismatch in at least three respective parameters;
   determining a plurality of corner values for the at least three respective parameters; and
   running (N−1) circuit simulations based on the determined plurality of corner values which are recalculated for each of the circuit simulations,
   wherein at least the step of the running (N−1) circuit simulations is implemented on a processor; and
   a plurality of mismatch corner values among $F_1, F_2, \ldots, F_N$ is determined from results of the (N−1) circuit simulations using the following equation:

$$\langle (F_i - F_j)^2 \rangle_{corner} = \frac{1}{N-1} \sum_{l=1}^{N-1} (F_{i,l} - F_{j,l})^2,$$

$$i, j = 1, 2, 3, \ldots, N-1, i \neq j,$$

where $F_{i,l}$ is a value of a performance target $F_i$ of an $i^{th}$ device in an simulation, and $F_{j,l}$ is a value of a performance target $F_j$ of a $j^{th}$ device in the simulation.

19. A computer program product comprising a tangible computer readable storage device having readable program code embodied in the tangible computer readable storage device, the computer program product includes at least one component operable to:
   determine a number N of semiconductor devices which have mismatch in at least three respective parameters;
   determine a plurality of corner values for the at least three respective parameters; and
   run at most N circuit simulations based on the determined plurality of corner values which are recalculated for each of the circuit simulations,
   wherein the plurality of corner values is determined based on the following equation:

$$P_{i,l}=\mu+s\sigma_{cm}+k\sigma_{m0}t_{i,l}, i=1,2,3,\ldots,N, l=1,2,3,\ldots,N-1,$$

where i is an $i^{th}$ device of the semiconductor devices, l is a $l^{th}$ circuit simulation of (N−1) circuit simulations, μ is a predetermined mean value for the at least three parameters, s is a corner value for chip mean part of variations, $\sigma_{cm}$ is a standard deviation for chip mean part of variations, k is a desired mismatch corner value among electric performance targets F1, F2, . . . , FN, $\sigma_{m0}$ is a standard deviation for mismatch part of variations, and $t_{i,l}$ is a plurality of mismatch corner values.

20. The computer program product of claim 19, wherein the at least one component is further operable to process one or more results of the at most N circuit simulations to determine one or more worst-case effects of the mismatch of the semiconductor devices.

21. A system implemented in hardware, comprising:
   a computer infrastructure operable to:
   determine a number N of semiconductor devices which have mismatch in at least three respective parameters;
   determine a plurality of corner values for the at least three respective parameters; and
   run N circuit simulations based on the determined plurality of corner values which are recalculated for each of the circuit simulations,
   wherein the plurality of corner values is determined based on the following equation:

$$P_{i,l}=\mu+s\sigma_{cm}+k\sigma_{m0}t_{i,l}, i=1,2,3,\ldots,N, l=1,2,3,\ldots,N-1,$$

where i is an $i^{th}$ device of the semiconductor devices, l is a $l^{th}$ circuit simulation of (N−1) circuit simulations, μ is a predetermined mean value for the at least three parameters, s is a corner value for chip mean part of variations, $\sigma_{cm}$ is a standard deviation for chip mean part of variations, k is a desired mismatch corner value among electric performance targets F1, F2, . . . , FN, $\sigma_{m0}$ is a standard deviation for mismatch part of variations, and $t_{i,l}$ is a plurality of mismatch corner values.

22. The system of claim 21, wherein the plurality of corner values is determined for the N circuit simulations based on the number N of the semiconductor devices.

23. A computer system for providing a device mismatch corner model for semiconductor device simulation, the system comprising:
   a CPU, a computer readable memory and a tangible computer readable storage media;
   first program instructions to determine a number N of semiconductor devices which have mismatch in at least three respective parameters;
   second program instructions to determine a plurality of corner values for the at least three respective parameters based on the number N of the semiconductor devices;
   third program instructions to run (N−1) or N circuit simulations based on the determined plurality of corner values which are recalculated for each of the circuit simulations, and based on user input; and
   fourth program instructions to process one or more results of the at most N circuit simulations to determine one or more worst-case effects of the mismatch of the semiconductor devices,
   wherein the first, second, third, and fourth program instructions are stored on the tangible computer readable storage media for execution by the CPU via the computer readable memory; and
   the plurality of corner values is determined based on the following equation:

$$P_{i,l}=\mu+s\sigma_{cm}+k\sigma_{m0}t_{i,l}, i=1,2,3,\ldots,N, l=1,2,3,\ldots,N-1,$$

where i is an $i^{th}$ device of the semiconductor devices, l is a $l^{th}$ circuit simulation of the (N−1) circuit simulations, μ is a predetermined mean value for the at least three parameters, s is a corner value for chip mean part of variations, $\sigma_{cm}$ is a standard deviation for chip mean part of variations, k is a desired mismatch corner value among electric performance targets F1, F2, . . . , FN, $\sigma_{m0}$ is a standard deviation for mismatch part of variations, and $t_{i,l}$ is a plurality of mismatch corner values.

24. A computer system for providing a device mismatch corner model for semiconductor device simulation, the system comprising:
   a CPU, a computer readable memory and a tangible computer readable storage media;
   first program instructions to determine a number N of semiconductor devices which have mismatch in at least three respective parameters;
   second program instructions to determine a plurality of corner values for the at least three respective parameters based on the number N of the semiconductor devices;
   third program instructions to run (N−1) or N circuit simulations based on the determined plurality of corner values which are recalculated for each of the circuit simulations, and based on user input; and
   fourth program instructions to process one or more results of the at most N circuit simulations to determine one or more worst-case effects of the mismatch of the semiconductor devices,
   wherein: the first, second, third, and fourth program instructions are stored on the tangible computer readable storage media for execution by the CPU via the computer readable memory; and
   the plurality of corner values is determined for (N−1) circuit simulations based on the following equation:

$$P_{i,l}=\mu+s\sigma_{cm}+k\sigma_{m0}t_{i,l}, i=1,2,3,\ldots,N, l=1,2,3,\ldots,N-1,$$

where i is an $i^{th}$ device of the semiconductor devices, l is a $l^{th}$ circuit simulation of the (N−1) circuit simulations, μ is a predetermined mean value for the at least three parameters, s is a corner value for chip mean part of variations, $\sigma_{cm}$ is a standard deviation for chip mean part of variations, k is a desired mismatch corner value among electric performance targets $F_1, F_2, \ldots, F_N$, $\sigma_{m0}$ is a standard deviation for mismatch part of variations, and $t_{i,l}$ is a plurality of mismatch corner values for the (N−1) circuit simulations; and the plurality of corner values is determined for N circuit simulations based on the following equation:

$$P_{i,l} = \mu + s\sigma_{cm} + k\sigma_{m0}u_{i,l}, \quad i,l=1,2,3,\ldots,N,$$

where l is an $l^{th}$ circuit simulation of the N circuit simulations, and $u_{i,l}$ is a plurality of mismatch corner values for the N circuit simulations.

* * * * *